(12) United States Patent
Kohsaka et al.

(10) Patent No.: US 7,153,589 B1
(45) Date of Patent: Dec. 26, 2006

(54) MO-W MATERIAL FOR FORMATION OF WIRING, MO-W TARGET AND METHOD FOR PRODUCTION THEREOF, AND MO-W WIRING THIN FILM

(75) Inventors: Yasuo Kohsaka, Yokohama (JP); Yoshiharu Fukasawa, Yokohama (JP); Yoshiko Tsuji, Kawasaki (JP); Mitsushi Ikeda, Yokohama (JP); Michio Sato, Yokohama (JP); Toshihiro Maki, Yokohama (JP)

(73) Assignee: Kabushiki Kaisha Toshiba (JP)

( * ) Notice: Subject to any disclaimer, the term of this patent is extended or adjusted under 35 U.S.C. 154(b) by 0 days.

(21) Appl. No.: 09/165,743

(22) Filed: Oct. 6, 1998

Related U.S. Application Data

(62) Division of application No. 08/663,251, filed as application No. PCT/JP94/02095 on Dec. 14, 1994, now Pat. No. 5,913,100.

(30) Foreign Application Priority Data

Dec. 14, 1993 (JP) ................................ P5-312936

(51) Int. Cl.
*B12F 3/00* (2006.01)
(52) U.S. Cl. ...................................... 428/546; 428/385
(58) Field of Classification Search ............... 428/546, 428/385; 313/60
See application file for complete search history.

(56) References Cited

U.S. PATENT DOCUMENTS 3,778,654 A   12/1973   Hueschen et al.

FOREIGN PATENT DOCUMENTS

| JP | 58-7864   | 1/1983  |
| JP | 60-11479  | 3/1985  |
| JP | 63-241164 | 10/1988 |
| JP | 1-231024  | 9/1989  |
| JP | 3-9177    | 2/1991  |
| JP | 3-130360  | 6/1991  |
| JP | 3-150356  | 6/1991  |
| JP | 5-194064  | 8/1993  |
| JP | 6-317814  | 11/1994 |

*Primary Examiner*—Laurie Scheiner
(74) *Attorney, Agent, or Firm*—Finnegan, Henderson, Farabow, Garrett & Dunner, L.L.P.

(57) ABSTRACT

A Mo—W material for the formation of wirings is discloses which, as viewed integrally, comprises 20 to 95% of tungsten and the balance of molybdenum and inevitable impurities by atomic percentage. The Mo—W material for wirings is a product obtained by compounding and integrating a Mo material and a W material as by the powder metallurgy technique or the smelting technique or a product obtained by arranging these materials in amounts calculated to account for the percentage composition mentioned above. The Mo—W material containing W in a proportion in the range of from 20 to 95% manifests low resistance and, at the same time, excels in workability and tolerance for etchants. The wiring thin film which is formed of the Mo—W alloy of this percentage composition is used as address wirings and others for liquid crystal display devices. The Mo—W target for the formation of wirings is composed of 20 to 95% of tungsten and the balance of molybdenum and inevitable impurities by atomic percentage and allows the Mo—W wiring thin film to be produced with high repeatability.

11 Claims, 7 Drawing Sheets

US 7,153,589 B1

MO-W MATERIAL FOR FORMATION OF WIRING, MO-W TARGET AND METHOD FOR PRODUCTION THEREOF, AND MO-W WIRING THIN FILM

This is a division of application Ser. No. 08/663,251, filed Sep. 6, 1996, now U.S. Pat. No. 5,913,100 which was filed under 35 U.S.C. § 371 claiming the benefit of International Application No. PCT/JP94/02095 filed Dec. 14, 1994. The contents of this application are being relied upon and incorporated herein by reference.

TECHNICAL FIELD

This invention relates to a Mo—W material for the formation of wiring, a Mo—W target for the formation of wiring and a method for the production thereof, and a Mo—W wiring thin film.

BACKGROUND OF ART

In recent years, the active matrix type liquid crystal display devices using as a switching element thereof a thin film transistor (hereinafter referred to as "TFT") formed by using an amorphous silicon (hereinafter referred to as "a-Si") film have been attracting attention. This is because there exists the possibility that a panel display having a large area, high accuracy, and high quality, namely a flat television, will be realized inexpensively by forming a TFT array with an a-Si film producible at low temperature on an inexpensive glass substrate.

In the construction of a display of a large area, however, the amount of resistance offered by the address wiring to be laid therein is increased because the gross length of the address wiring is inevitably increased to a marked extent. This increase in the amount of resistance of the address wiring entrains the problem of conspicuously delaying gate pulses to be given to switch elements and rendering control of a liquid crystal difficult. It is, therefore, necessary that the delay of gate pulses be avoided while retaining at least such parameters as wiring widths intact.

As one measure to avoid the delay of gate pulses, the idea of forming the address wirings with a wiring material which possesses as low resistivity as permissible may be conceived. At present, the Mo—Ta alloy film is often used as the material for the address wirings. Since this alloy film has such large resistivity as about 40 Ω·cm, it is held that the resistivity of the Mo—Ta alloy film renders difficult the realization of a display of a large area. Particularly, the direct-view type display of high accuracy using about 1000 address wirings is considered to require a wiring material possessing resistivity of not more than about 20 μΩcm.

The new wiring material of such quality as mentioned above is required to possess such characteristics as will be shown below in addition to the low resistivity mentioned above. Since the insulation between the wirings and the address wirings which are formed on an interlayer insulating film must be heightened by improving the step coverage of the interlayer insulating film formed on the address wirings, this new wiring material must be capable of being tapered.

The realization of a liquid crystal display device which, owing to the formation of address wirings with a wiring material of low resistance, is enabled to repress the delay of gate pulses and, at the same time, acquire necessary insulation and enjoy high reliability is yearned for. The desire of this kind has been expressed not merely for liquid crystal display devices having a display of a large area but equally for liquid crystal display devices having wirings and wiring intervals narrowed for the purpose of exalting the accuracy of display or liquid crystal display devices having an opening ratio improved by decreasing the width of wirings.

The conventional liquid crystal display devices have such problems as shown below in addition to those already remarked above. FIG. 5 is a cross section of a TFT (switching element) and a storage capacity part to be used in a liquid crystal display device.

By sputtering a Mo—Ta alloy, a gate electrode 2, address wirings, address wirings, and a Cs line 9 are simultaneously formed on a glass substrate 1 as shown in FIG. 5. Through the medium of a gate insulating film 3 which is formed thereon, an a-Si active layer 4 is superposed. On the opposite end parts of this active layer 4, $n^+$ a-Si layers 5a and 5b are deposited. Then, through the medium of the gate insulating film 3, an ITO picture element electrode 8 is formed. Subsequently, an Al source electrode 6a having a part thereof connected to the n a-Si layer 5a, a drain electrode 6b having a part thereof connected to the $n^+$ a-Si layer 5b and the picture element electrode 8, and data wirings are simultaneously formed.

The conventional TFT shown in FIG. 4 has a picture element electrode and data wirings formed in one and the same layer without intervention by an insulating film and, therefore, has the possibility of forming a short circuit and giving birth to point defects. To avoid the point defects, the configuration which has a source electrode, a drain electrode, and data wirings laid out first, an interlayer insulating film subsequently formed thereon, and a picture element electrode finally superposed thereon has been conceived and studied as a possible measure of improvement. To realize this configuration, the following requirements must be satisfied.

(1) The data wirings and others should possess excellent tolerance for the etchant for use on the interlayer insulating film and to the ITO etchant for the picture element electrode.

(2) For the purpose of improving the step coverage of the interlayer insulating film thereby heightening the insulation between the data wirings and the picture element electrode, the data wirings should be capable of being tapered.

Since none of the wiring materials developed to date fulfils the requirements mentioned above, it has been difficult to realize the configuration mentioned above and improve the reliability of a liquid crystal display device. Since it is important to lower the ratio of occurrence of point defects for the development of a display of a large area, the desirability of developing a liquid crystal display device of such high reliability has been finding growing recognition. For this reason, it is essential to develop a wiring material which satisfies the requirements mentioned above and also a target for the formation of a wiring.

Incidentally, the Al and the Ta type alloy form an oxide film on their surfaces and offer an increased contact resistance to the metallic wirings which are formed in the layer superposed thereon and, therefore, require a step for the removal of the oxide film from their surfaces. They further require a barrier metal to prevent ITO and Al from reacting with each other and, therefore, are at a disadvantage in inevitably increasing the number of steps of the process of manufacture.

An object of this invention is to provide a material for wirings having low resistance and permitting the work of tapering, a target for the formation of wiring, and a wiring thin film. A further object of this invention is to provide a material for wirings having low resistance and possessing high tolerance for the etchants for an interlayer insulating film, ITO, or the like, a target for the formation of wirings, and a wiring thin film. Another object of this invention is to provide a method for the production of a target for the formation of wirings, which method permits such a target for the formation of wirings as mentioned above to be manufactured with high repeatability.

DISCLOSURE OF THE INVENTION

The present inventors, with a view to attaining the objects mentioned above, have systematically continued experiments and studies on various metals and alloys in search for a wiring material fit for display devices such as liquid crystal display devices to find for the first time in the art that the film of an alloy composed of molybdenum (Mo) and tungsten (W) at a ratio in a specific range has low resistivity and highly satisfactory formability as compared with the film made solely of either of the component elements, Mo and W. This invention has been perfected as a result.

The first aspect of this invention, i.e. the Mo—W material for the formation of wirings, is characterized by the fact that the material as viewed integrally is composed of 20 to 95% of tungsten and the balance of molybdenum and inevitable impurities by atomic percentage.

The second aspect of this invention, i.e. the Mo—W target for the formation of wiring, is characterized by the fact that the target as viewed integrally is composed of 20 to 95% of tungsten and the balance of molybdenum and inevitable impurities by atomic percentage. The Mo—W target of this invention for the formation of wiring is characterized by particularly consisting essentially of a Mo—W alloy composed of 20 to 95% of tungsten and the balance of molybdenum and inevitable impurities by atomic percentage and the Mo—W alloy having relative density of not less than 99%, average grain size of not more than 200 μm, and Vickers hardness, Hv, of not more than 350.

The third aspect of this invention, i.e. the Mo—W wiring thin film, is characterized by being composed of 20 to 95% of tungsten and the balance of molybdenum and inevitable impurities by atomic percentage.

The method of this invention for the production of a Mo—W target for the formation of wirings is characterized by comprising a step of shaping a mixed powder composed of 20 to 95% of tungsten and the balance of molybdenum and inevitable impurities by atomic percentage, a step of sintering the shaped mass obtained in the shaping step in an inert ambience, and a step of hot working the sintered mass obtained in the sintering step.

Now, this invention will be described more specifically below.

The Mo—W material of this invention for the formation of wirings is so prepared as to be composed, as viewed integrally, of 20 to 95% of tungsten and the balance of molybdenum and inevitable impurities by atomic percentage. As concrete forms of the Mo—W material of this invention for the formation of wirings, the following materials may be cited, for example.

(A) The materials obtained by compounding and integrating (alloying, for example) a Mo material and a W material in such a mixing ratio as to account for a proportion of W in the range of from 20 to 95% by atomic percentage; such as, for example, sinters produced by the powder metallurgy technique and ingots by the smelting technique.

(B) The materials obtained by combining a Mo material and a W material so that the proportion of W, as viewed integrally, may be in the range of from 20 to 95% by atomic percentage.

If the proportion of W in the Mo—W material mentioned above is less than 20% by atomic percentage, the Mo—W material will suffer undue increase in resistance and undue decrease in the tolerance for such etchants as used on the interlayer insulating film and the ITO. Conversely, if this proportion of W exceeds 95%, the Mo—W material will likewise suffer undue increase in resistance. In other words, when the Mo—W material has a proportion of W in the range of from 20 to 95%, it possesses low resistance and excels in tolerance for etchants. Further, the Mo—W material which has the percentage composition mentioned above has the advantage that, when formed in the shape of a thin film, it permits a tapering work.

Preferably, the proportion of W in the Mo—W material of this invention for the formation of wirings is in the range of from 20 to 70% by atomic percentage. So long as the proportion of W falls in this range, the wiring thin film which is formed of the Mo—W material by the sputtering technique, for example, is obtained at a practically excellent sputter rate. For the sake of allowing the Mo—W material to acquire superior tolerance for etchants as well as such an excellent sputter rate as mentioned above, the proportion of W ought to be in the range of from 25 to 45%.

In order for the wirings produced with the Mo—W material of this invention for the formation of wiring to acquire improved characteristic properties, the content of the impurity elements in the Mo—W material ought to be decreased to the fullest possible extent (which remarks hold good for the Mo—W target and the Mo—W wiring thin film). The content of oxygen as an impurity, for example, ought to be not more than 500 ppm, preferably not more than 200 ppm, more preferably not more than 100 ppm, and still more preferably not more than 50 ppm. The reason for this restriction of the oxygen content is that the Mo—W material generally suffers occurrence of numerous pores and degradation of density when the oxygen content is unduly large.

The degradation of density results in aggravating the occurrence of particles. To lower the oxygen content, such measures as subjecting the powder to reduction with hydrogen or improving the sintering property may be adopted.

The Mo—W wiring thin film of this invention is made of a Mo—W alloy of the percentage composition mentioned above. The reason for specifying the proportion of W in the composition and the preferred range of this proportion which exist in this case are the same as described above. The address wirings as in the liquid crystal display device which are made of the Mo—W wiring thin film operate as components of low resistance to the gate pulses. The gate pulses which are transmitted through the address wirings, therefore, are hardly affected by the delay action which originates in the resistant components of the address wirings. Consequently, to the switching elements which are serving to drive liquid crystals, gate pulses which have no delay are delivered.

Further, since the Mo—W wiring thin film of this invention is capable of being tapered, the interlayer insulating film which is formed on the address wiring made of the wiring thin film enjoys a highly satisfactory step coverage. As a result, high dielectric strength is obtained between the wirings and the address wirings to be formed on the interlayer insulating film. The Mo—W wiring thin film of this invention possesses excellent tolerance for such etchants as are used on the interlayer insulating film, the ITO, or the like. It is, therefore, capable of exalting the insulation between the data wirings and picture element electrodes. Owing to these features, liquid crystal display devices of high reliability can be realized even when they are produced with display regions of a large area.

The Mo—W wiring thin film of this invention effectively operates not only in liquid crystal display devices aimed at enlarging areas of display but also in liquid crystal display devices having wirings and intervals of wirings narrowed by exalting the accuracy of display or liquid crystal display devices having opening ratios improved by decreasing widths of wirings. The Mo—W wiring thin film of this invention ideally realizes the reduction of widths of wirings and intervals of wirings. Further, the Mo—W wiring thin film of this invention is effectively used not only as wirings or others for liquid crystal display devices but also as wirings as for plasma display devices, solid display devices, and flat display devices using a field-emission type cold cathode.

The Mo—W wiring thin film of this invention is further at an advantage in the fact that an oxide film formed on the surface thereof has only small resistance. For this reason, it is allowed to form ideal contact as with metallic wirings laid in an overlying layer without requiring a preparatory treatment to remove the oxide film. Unlike the conventional liquid crystal display devices, therefore, the liquid crystal display devices which are produced by the use of the Mo—W wiring thin film of this invention can be constructed with the gate electrodes, the address wirings, and the Cs wires thereof in a state having their surfaces coated with an oxide film.

The Mo—W target of this invention for the formation of wirings allows the Mo—W wiring thin film possessing such characteristic properties as mentioned above to be formed with high repeatability by such a thin film forming method as the sputtering technique. It utilizes the Mo—W material of this invention for the formation of wirings. The Mo—W target for the formation of wirings is so prepared as to be composed, as viewed integrally, of 20 to 95% of tungsten and the balance of molybdenum and inevitable impurities by atomic percentage for the same reason as given above with respect to the Mo—W material for the formation of wirings. The reason for specifying the proportion of W in the composition and the preferred range of this proportion are the same as already described above.

The composition of the Mo—W wiring thin film can not be generally fixed because it is widely varied by such numerous conditions existing during the formation of the wiring thin film as, for example, the ambience in which the sputtering is carried out and the magnitude of the voltage used therefor. The Mo—W wiring thin film of fully satisfactory quality can be obtained so long as the proportion of W falls in the range mentioned above.

The Mo—W target of this invention for the formation of wirings is allowed to assume a varying form. As concrete forms of the Mo—W target, the same materials as cited above as concrete forms of the Mo—W material [the materials of (A) and (B)] may be cited. Since Mo and W are different in sputter efficiency, a target such as, for example, an alloy target which is produced by compounding and integration a Mo material and a W material in the form of (A) mentioned above proves particularly suitable for the purpose of diminishing the difference of composition between the target and the wiring thin film to be obtained and attaining a uniform film composition.

The Mo—W alloy target mentioned above is obtained with a varying density and texture, depending on the method of production and the conditions of production such as, for example, particle diameters of powders, forming conditions, sintering conditions, and mechanical working conditions to be involved in the powder metallurgy technique which will be described more specifically hereinbelow and smelting and casting conditions to be involved in the smelting technique. The density, texture, and others of the target have their effects exerted on the properties of the wiring thin film to be ultimately produced. For the purpose of precluding the occurrence of particles during the work of sputtering and improving the properties of the Mo—W wiring thin film, therefore, the Mo—W target ought to possess a dense and fine metallic texture. The particles form a cause for producing breaks or short circuits in the wiring. To be more specific, the relative density of the Mo—W target ought to be not less than 98% and the average diameter of crystals thereof to be not more than 200 µm.

Since the Mo—W target mentioned above is a polycrystal formed by the aggregation of grains of different orientations, it has the sputter rate thereof varied by the orientations of the grains. Thus, the sputtered surface of the Mo—V target gains in irregularity and widens differences of level between the grains in proportion as the grains grow in size. The sputter grains, therefore, are liable to adhere to and accumulate on the stepped levels and the grain surfaces. Particularly, the sputter grains impinging on the target in diagonal directions unstably accumulate in the central part and the terminal parts of the target. The sputter grains which are unstably accumulated as described above (or a film formed by the sputter grains so accumulated) separate and fall off during the course of sputtering and possibly form a cause for the occurrence of particles. Further, the parts of large differences of level are caused to generate splashes by abnormal discharge and induce emission of particles.

The occurrence of particles mentioned above can be repressed by decreasing the sizes of the grains in the Mo—W target. The average diameter of the grains, therefore, ought to be not more than 200 µm, preferably not more than 100 µm, and more preferably not more than 50 µm. The term "diameter of grains" which is used in this invention refers to the magnitude of "(major diameter+minor diameter)/2" of the grains observed in a 100-magnification section of a ground surface taken arbitrarily in the direction of the sputter surface. The average diameter of grains means the average of the diameters of the grains which are present within not less than 30 fields of view selected in the polished surface mentioned above.

When pores are present in the Mo—W target, the sputter grains which are beaten out by the Ar ions driven into the pores during the sputtering work are accumulated on the edges of the pores and consequently suffered to form protuberances. These protuberances induce abnormal discharge and give rise to particles. The occurrence of these particles can be repressed by densifying the Mo—W target. The relative density of the Mo—W target, therefore, ought to be not less than 98%, preferably not less than 99%, and more preferably 100%.

The residual machining strain in the Mo—W target also has an effect to bear on the occurrence of particles. If the target retains large residual machining strain, the residual strain induces the sputter rate to be locally varied. The resultant difference in the sputter rate produces numerous stepped parts in the sputter surface and increases the amount of particles suffered to occur. The machining strain can be eliminated by a heat treatment and this elimination can be rated by the hardness which decreases in proportion as the machining strain decreases. The Mo—W target ought to possess Vickers hardness of not more than 400, preferably not more than 300, and more preferably not more than 250.

The Mo—W target mentioned above, depending on the method of production thereof and the conditions for the production, can assume a varying texture such as, for example, a texture of a uniform solid solution phase of Mo and W, a texture having an elemental phase of Mo and/or W in a solid solution phase of Mo and W, and a texture having a solid solution phase of Mo and W in an elementary phase of Mo and/or W. These textures may be selected to suit particular properties aimed at. Particularly, since Mo and W are expected to be uniformly distributed in the target, the Mo—W target ought to have a texture of a uniform solid solution phase of Mo and W.

As more concrete forms of the Mo—W target of this invention for the formation of wirings, the following targets may be cited, for example.

(a) The targets which are produced by the powder metallurgy technique using a mixed powder containing a Mo powder and a W powder at a prescribed mixing ratio.

(b) The targets which are produced by the smelting technique using Mo and W in amounts calculated to satisfy a prescribed mixing ratio.

(c) The targets in which target pieces formed of Mo and inevitable impurities and target pieces formed of W and inevitable impurities are arranged complexly as divided by kind of metal, with the mixing ratio of Mo and W being adjusted by the ratio of areas of the two target pieces.

The targets (a) and the targets (b) are concrete examples of the form of (A) mentioned above. The targets (c) are concrete examples of the form of (B) mentioned above.

One example of the method for the production of the target (a) mentioned above will be described below. First, a uniform mixed powder is prepared by mixing Mo powder and W powder in a ball mill. In this case, nylon or a ceramic substance may be used as the material for the balls. The amount of impurities suffered to be incorporated in the target can be decreased, however, by using Mo or W as the material for the inner wall of the ball mill or for the balls to be used in the ball mill.

Then, the mixed powder mentioned above is packed as in a carbon mold and sintered. For this sintering, a hot press disposed in a vacuum can be used. For the purpose of improving the sintering property of the mixed powder and densifying the resultant sinter, the combination of isotropic pressure forming as by the use of a cold hydrostatic press (CIP) with sintering carried out in such a reducing ambience as the ambience of hydrogen may be adopted. The sinter obtained by such a method as described above is further subjected to a HIP treatment or to such a hot working operation as forging or rolling to prepare effectively a more densified blank for the target. The hot press ought to be carried out under the conditions of heating temperature of not less than 1973K and planar pressure of not less than 20 MPa, preferably heating temperature of not less than 2073K and planar pressure of not less than 30 MPa. The sintering which follows the pressure forming ought to be carried out at a temperature of not less than 1973K, preferably not less than 2073K. The HIP treatment is advantageously carried out under the conditions of heating temperature of not less than 1773K and pressure of not less than 150 MPa, preferably heating temperature of not less than 2073K and pressure of not less than 180 MPa. These lower limits are essential because the sintering will not easily proceed and the blank for a target will not be easily obtained from a sinter of high density if the temperature of heating and the planar pressure are unduly low.

The blank for a target which is obtained by the powdery metallurgy technique mentioned above is subjected to such a mechanical working as grinding to produce a Mo—W target in a prescribed shape.

The target (b) is produced by the following method, for example. First, a sinter composed of Mo, W, and inevitable impurities is prepared by the powder metallurgy technique and an ingot is produced by subjecting the sinter to the smelting technique such as electron fusion. Then, the ingot is subjected optionally to hot working such as forging or rolling and then to such a mechanical working as grinding to produce a Mo—W target in a prescribed shape.

The Mo—W target of this invention for the formation of wirings, for the purpose of preventing the occurrence of particles during the sputtering operation, ought to satisfy such conditions imposed concerning density, texture, and others as described above. For this reason, it is advantageous to adopt the method of production which combines powder metallurgy technique with hot working. When the sinter produced by the powder metallurgy technique is subjected to hot working, the blank for a target which is consequently obtained is allowed to retain a fine grain size and attain heightened density as well. This blank allows production of a Mo—W target having relative density of not less than 98% and an average grain size of not more than 200 μm, for example. The blank for a target which is obtained by the smelting technique tends to suffer coarsening of grain size and, therefore; has the possibility of losing mechanical strength and sustaining a crack and other damage while undergoing hot working.

The sinter which is destined to undergo the hot working mentioned above ought to possess relative density of not less than 90%. If the relative density of the sinter is unduly low, the hot working which is performed thereon will possibly fail to densify ultimately the blank for the target as expected. The sinter which is subjected to the hot working ought to be the product of sintering a pressure formed mass obtained as by CIP. In the case of the sinter which is obtained by a hot press, the possibility of Mo and W reacting with the carbon mold will arise when the temperature is raised to a level at which necessary densification is attained.

It is safely concluded that the Mo—W target of the present invention for the formation of wirings is produced advantageously by a method which comprises a step of shaping (particularly by the CIP or the like) a mixed powder prepared at a prescribed percentage composition (W: 20~95 at %), a step of sintering the shaped mass in such a reducing ambience as the ambience of hydrogen, and a step of hot working the resultant sinter. The blank for a target which is obtained at the end of the step of hot working, for the purpose of being relieved of residual machining strain, ought to undergo further a strain-relieving heat treatment.

The specific conditions under which the method for the production of the target mentioned above is to be carried out are as follows. For the production of the Mo—W target which possesses such density, metal texture, and hardness as mentioned above, the temperature of treatment during the sintering in the reducing ambience such as the ambience of hydrogen, the temperature of treatment during the hot working and the ratio of hot working, the temperature of the subsequent heat treatment, or the like constitute important factors.

First, the sintering temperature in the reducing ambience such as the ambience of hydrogen affects the density of the blank for a target. The sintering temperature, therefore, ought to be not less than 2173K. If the sintering temperature is less than 2173K, it will be difficult to increase the relative density of the blank beyond 98% even when the sinter is subsequently hot rolled. Though the density is improved in proportion as the duration of the sintering is lengthened, the productivity of the sintering is degraded in proportion as the duration is increased. Thus, the sintering time is proper in the approximate range of from 5 to 30 hours. The temperature of treatment ought to not less than 2272K, preferably not less than 2473K and the sintering time ought to be in the approximate range of from 10 to 25 hours.

The temperature of the treatment of hot working constitutes an important factor for preventing the sinter under treatment from sustaining a crack and ensuring stable production of the blank. Particularly since pure tungsten is liable to be suddenly embrittled at temperatures below 1473K, the temperature of the treatment ought to be heightened in proportion as the W content in the sinter under treatment is increased; Advantageously, therefore, the temperature of the treatment is not less than 1673K, preferably not less than 1873K. In consideration of the heat equalizing property of the sinter, the heating time ought to be in the approximate range of from 2 to 8 hours. Further, when the hot working is implemented in the form of hot rolling, the ratio of reduction by rolling ought to be not less than 50% for the purpose of raising the relative density of the target beyond 98%. Advantageously, the ratio of reduction is not less than 60%, preferably not less than 70%. The term "ratio of reduction (%)" which is used in this invention refers to the ratio of at the thickness of the sinter before the rolling to the thickness thereof after the rolling and is expressed as [(thickness of the sinter before rolling–thickness thereof after rolling)/thickness thereof before rolling)×100].

The strain-relieving heat treatment which is performed subsequently to the hot rolling advantageously proceeds at temperatures in the range of from 1473~1923K. If the temperature of this heat treatment is less than 1473K, the possibility arises that the relief of residual strain will not be fully attained. Conversely, if this temperature exceeds 1923K, the possibility arises that pores will occur in the blank and induce generation of particles. It is more advantageous to set the temperature of the strain-relieving heat treatment in the range of from 1673~1823K.

It is advantageous from the viewpoint of preventing the occurrence of particles during the formation of a thin film, that the targets (a) and the targets (b) mentioned above be produced in one-piece masses. For the purpose of producing targets in large sizes, it is allowable to use a plurality of targets of one and the same composition in a suitable combination. In this case, the plurality of targets are fixed by soldering as to a backing plate. It is advantageous for the sake of preventing the generation of particles particularly from the edge parts thereof that the adjoining targets be joined by means of diffusion. For the union thereof by diffusion, various methods are available such as, for example, a method for directly joining the adjacent targets, a method for joining the adjoining targets through the medium of Mo and/or W disposed along their joints, and a method for joining the adjoining targets through the medium of a plating layer of Mo and/or W disposed along their joints.

Now, one example of the method for the production of a target (c) will be described below. First, Mo target pieces and W target pieces are produced by such a smelting technique as the powder metallurgy technique or electron fusion. The resultant ingots are optionally subjected to mechanical working. A Mo—W target is obtained in a prescribed shape by dividing the ingots by kind of metal and arranging them complexly. The compounding ratio of Mo and W is adjusted as required by controlling the areal ratio of the two metals involved.

The characteristic properties of the thin film to be obtained are affected by the textures and others of the target pieces. The particle diameters of the powders, the condition of shaping, the condition of sintering, and the condition of mechanical working in the powder metallurgy technique and the melting and casting conditions in the smelting technique, therefore, ought to be suitably selected. The targets to be produced, therefore, are enabled to acquire widely varied textures, crystal structures, and others by varying the various production conditions as described above. It is advantageous that the texture, density, and others of each target piece be in conformity with those of the alloy target mentioned above.

The target (c) comprises a complexly arranged plurality of target pieces. For the purpose of precluding the generation of particles particularly from the edge parts of target pieces, it is necessary that the adjacent target pieces be joined by diffusion. For the union thereof by diffusion, various methods are available such as, for example, a method for directly joining the adjacent targets, a method for joining the adjoining targets through the medium of Mo and/or w disposed along their joints, and a method for joining the adjoining targets through the medium of a plating layer of Mo and/or W disposed along their joints.

MODE FOR EMBODYING THE INVENTION

Now, this invention will be described below with reference to working examples.

EXAMPLE 1

A plurality of uniform mixed powders were obtained by weighing out a Mo powder having an average particle diameter of 10 μm and a W powder having an average particle diameter of 10 μm in amounts calculated to account for varying atomic percentages, placing each set of Mo and W powders in a ball mill having the inner wall coated with Mo, and mixing them for 48 hours by the use of balls made of nylon. The mixed powders were each packed in a carbon mold and then sintered in a vacuum hot press at a temperature of 2073K under planar pressure of 30 MPa for five hours to obtain sinters having a density of 97%. The sinters thus obtained were each subjected to the mechanical workings of cutting and grinding to produce Mo—W targets measuring 250 mm in diameter and 8 mm in thickness and having a varying composition.

These Mo—W targets were each bonded with an In type solder to a packing plate made of oxygen-free copper and then set in place in a sputtering device. In this sputtering device, the targets were set at a distance of 70 mm from a glass substrate destined to form a film-forming substrate, the glass substrate was heated, and a DC power source was turned on to sputter the targets with an input power of 1 kW under an Argon pressure of 0.5 Pa, to form respective Mo—W alloy films.

Figure 1:
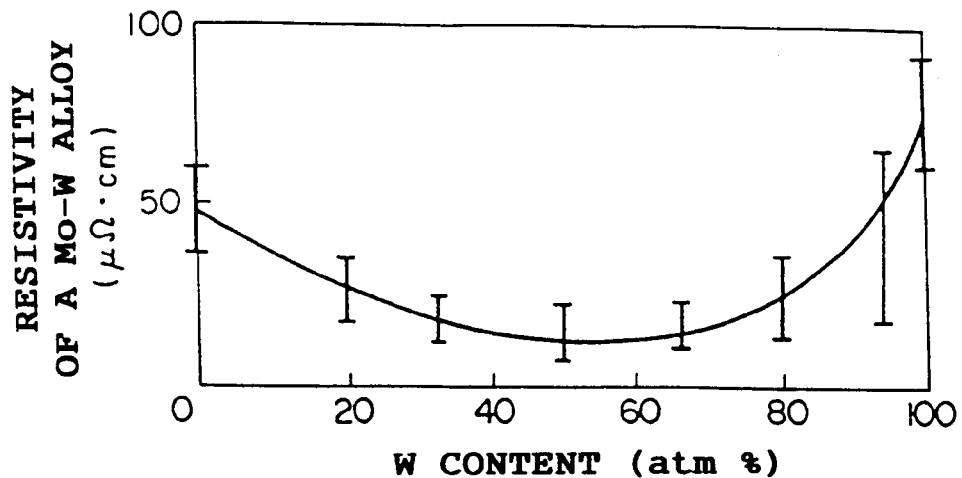
FIG. 1 is a diagram showing the relation between the resistivity and the W content of a Mo—W alloy.

The Mo—V alloy films consequently obtained were tested for resistivity. The results are shown in relation to respective W contents in FIG. 1. It is clearly noted from FIG. 1 that the Mo—W wiring thin films (having W contents of from 20 to 95 at %) of this invention had notably lower magnitudes of resistivity than 40 μΩcm and that these magnitudes were lower than those of resistivity of the films formed of the component materials, Mo film and W film, of this invention.

Figure 5:
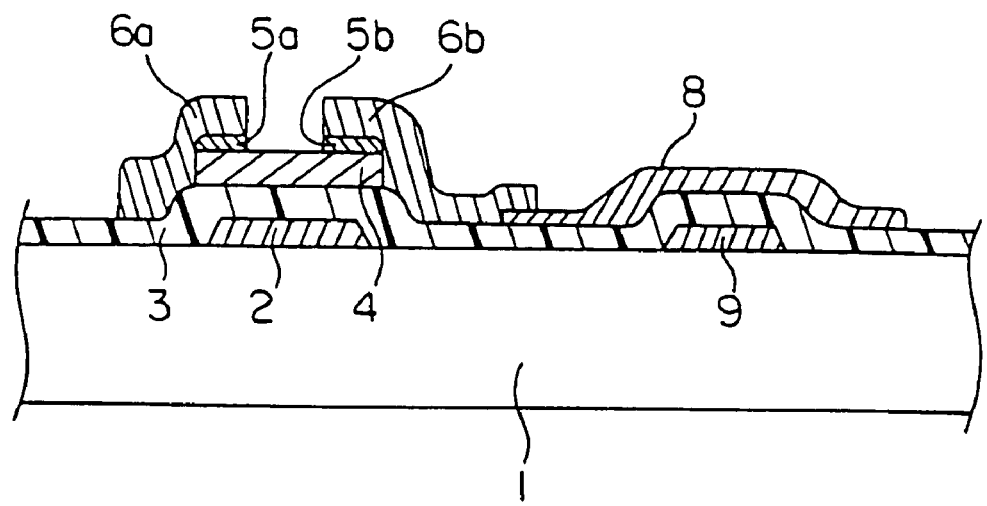
FIG. 5 is a cross section of a TFT and a storage capacity part to be used in a liquid crystal display device.

Now, an example of the use of a wiring thin film formed with the Mo—W target mentioned above in a liquid crystal display device will be described below. FIG. 5 is a cross section showing one example of the arrangement of a TFT (switching element) and a storage capacity part to be used in the liquid crystal display device. The construction of the TFT and the storage capacity part and the process thereof will be described.

On a glass substrate 1, the Mo—W target of this invention mentioned above was sputtered in 300 nm to form simultaneously a gate electrode (control electrode) 2, an address line, and a Cs line 9. Then, by the plasma CVD, a-Si islands were formed by continuously depositing an oxide film 3 in 350 nm, an a-Si active layer 4 in 300 nm, and n⁺ a-Si layers 5a and 5b each in 50 nm. Subsequently, ITO was sputtered in 120 nm to form a picture element electrode 8. The portion of $SiO_x$ in the contact part was etched with dilute hydrofluoric acid (HF) to form a contact hole. Then, by sputtering a prescribed wiring metal such as, for example, Al and wet etching it, a source electrode (first electrode) 6a, a drain electrode (second electrode) 6b, and data wiring were simultaneously formed. In this case, the surface required an oxidizing treatment prior to the sputtering of Al.

The Mo—W wiring thin film of this invention formed here with the Mo—W target of this invention had low resistivity and, therefore, the address wiring which was formed with this wiring thin film showed proportionately low resistivity. As a result, the wiring resistance caused no delay in the gate pulses and the relevant switching element obtained gate pulses which were not delayed.

Since the Mo—W wiring thin film of this invention was capable of being tapered, the interlayer insulating film deposited on the address wirings formed with this alloy film enjoyed fully satisfactory step coverage and allowed maintenance of high dielectric strength. The liquid crystal display device of high reliability could be realized even when the display region was formed with a large area. The relation between the mixing ratio of the Mo—W target and the taper angle is shown in Table 1.

TABLE 1

| Target composition (at %) | | Taper angle |
|---|---|---|
| W | Mo | |
| 0 | 100 | 20° |
| 30 | 70 | 25° |
| 50 | 50 | 32° |
| 70 | 30 | 37° |
| 100 | 0 | 48° |

The taper angle was determined by observing the section of a sample thin film with the aid of SEM and measuring the angle of the thin film with the glass substrate. It is clearly noted from Table 1 that the taper angle increased in proportion as the proportion of W increased and that the tapering was obtained satisfactorily while the target composition was within the range specified by this invention.

Then, for the purpose of testing for chemical resistance, the Mo—W alloy films of the varying compositions mentioned above were treated with the etchant for ITO, a material for the picture element electrode, BHF, an etchant for the interlayer insulating film, and the etchant for Al to find respective etching rates (nm/min). The results are shown in FIG. 2.

Figure 2:
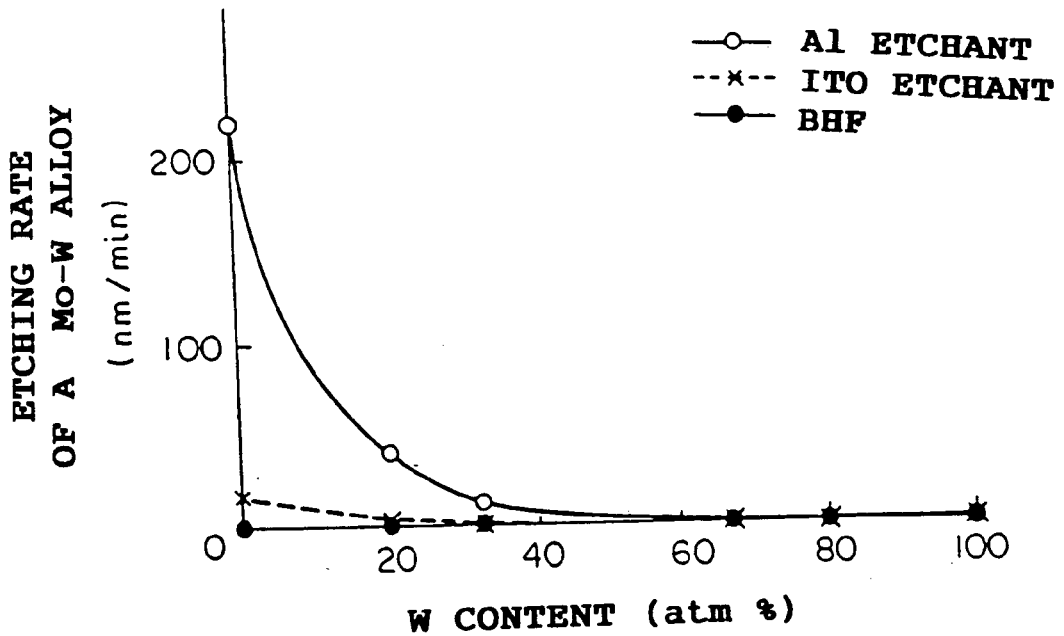
FIG. 2 is a diagram showing the relation between the etching rate of a Mo—W alloy in a varying etchant and the W content of the Mo—W alloy.

It is clearly noted from FIG. 2 that the etching rate of the Mo—W-alloy film was not more than 8 nm/min with the etchant for ITO, not more than 3 to 40 nm/min with the etchant for Al, and perfectly nil with the BHF, the etchant for the interlayer insulating film. It is remarked that absolutely no etching occurred when the proportion of W was 50 at % or over. The data indicate that such wirings as gate electrodes and data lines which underlie the interlayer insulating film are not corroded by any of the etchants mentioned above even when the interlayer insulating film is suffered to form pinholes therein. Thus, the liquid crystal display device using the interlayer insulating film is at an advantage in enjoying ample freedom in the design of structure/design of process of the component layers from the interlayer insulating film upward.

Figure 3:
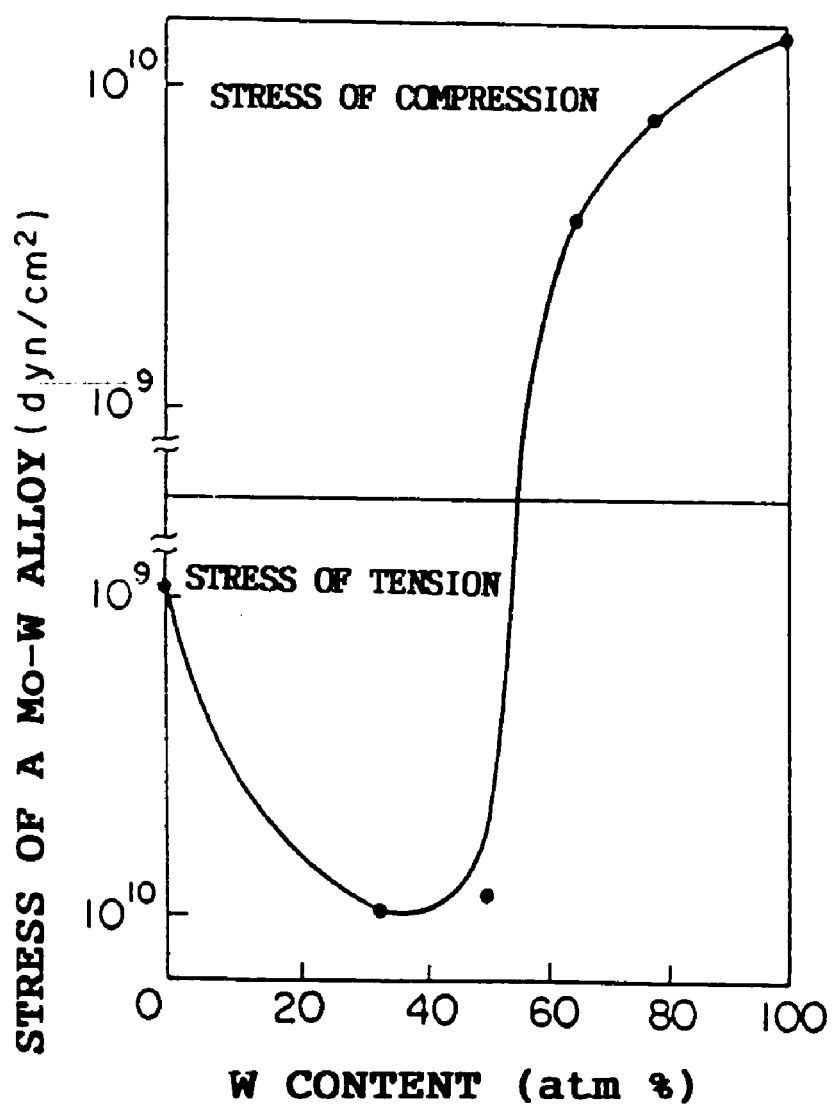
FIG. 3 is a diagram showing the relation between the stress and the W content of a Mo—W alloy.

FIG. 3 shows the results of the test performed on the Mo—W alloys of the varying compositions mentioned above to determine their stress (dyn/cm²). The data indicate that since the stress is markedly varied by the mixing ratio of Mo and W, the stress can be decreased by adjusting the mixing ratio.

Figure 4:
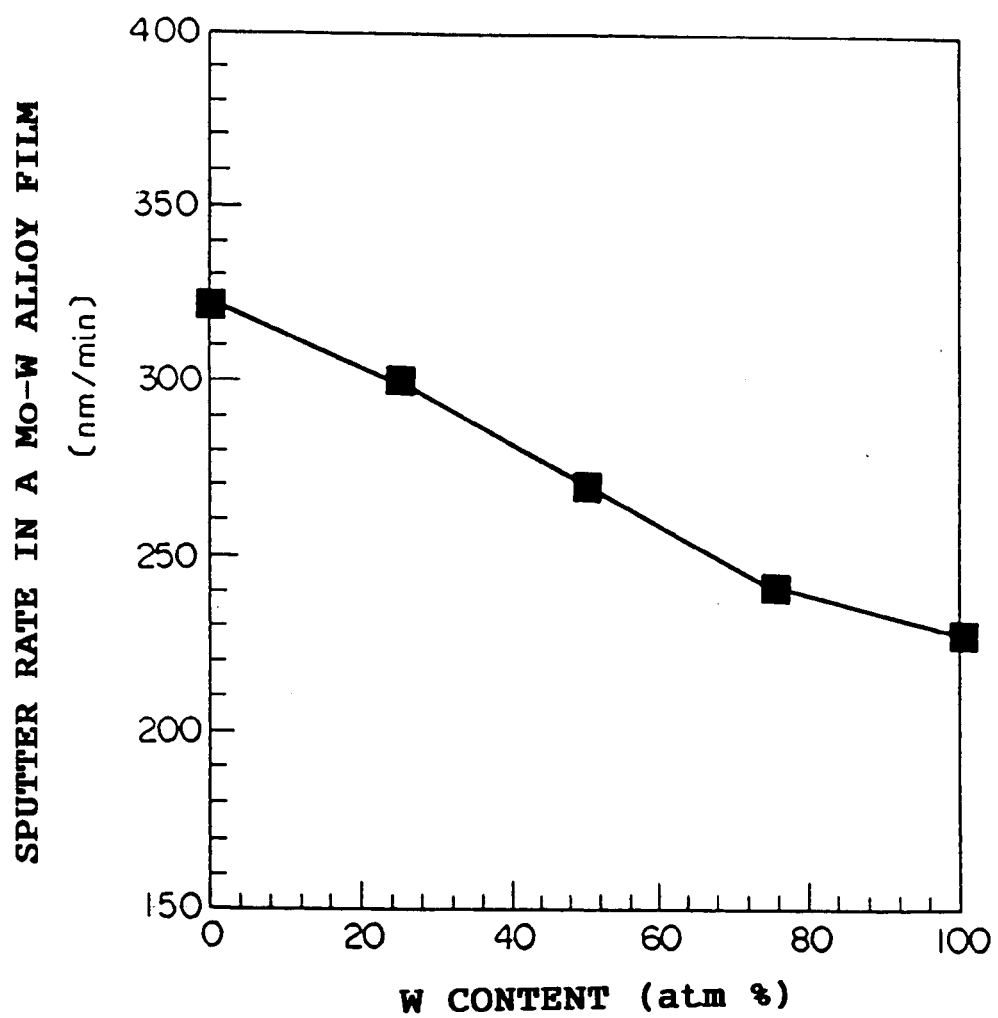
FIG. 4 is a diagram showing the relation between the W content and the sputter rate in a Mo—W alloy film produced by sputtering a Mo—W target.

FIG. 4 shows the results of the test performed on Mo—W alloy film obtained by sputtering Mo—W targets to determine their sputter rates (nm/min). The sputter rates were determined by the following method. First, the points selected on the lines drawn from the four corners of a given glass substrate to the central part of the substrate and the points selected on the lines drawn from the central parts of the four sides of the substrate to the opposed sides of the substrate were marked with an oily ink for the purpose of degrading the adhesiveness of a Mo—W alloy film to be formed by sputtering. Then, the Mo—W alloy film was formed by sputtering and the portions of the Mo—W alloy film deposited on the portions marked with the oily ink were peeled off the substrate by applying an adhesive tape to the portions and peeling the adhesive tape from the surface of the Mo—W alloy film. Thereafter, the oily ink was exclusively wiped off with an organic solvent to expose the glass substrate. The differences of level between the portions from which the Mo—W film was peeled by the adhesive tape and the portions from which no Mo—W film was peeled with the aid of a level difference tester at fixed positions selected on the lines drawn from the edge parts to the central parts. The film thicknesses thus found were compared as sputter rates (nm/min).

It is clearly noted from FIG. 4 that the sputter rate improved in proportion as the ratio of W tended to decrease. In consideration of the resistance to etchants shown in FIG. 2, the data of FIG. 4 are believed to indicate that the proportion of W ought to be in the range of from 25 to 45 at %.

The working example described above is one embodiment of this invention. It can be modified with the thicknesses of the component layers and the methods of film formation suitably altered. Notwithstanding such modifications, this invention produces the same effect as is obtained in the present example. The TFT may be in some other structure such as is obtained by providing stoppers for the insulating film on channels. The storage capacity part may be in such a structure that it is formed in wirings in the same layer as the gate electrode and in wirings in the same layer as the data wirings.

EXAMPLE 2

Uniform mixed powders were obtained by weighing out a Mo powder having an average particle diameter of 10 μm and a W powder having an average particle diameter of 10 μm in amounts calculated to account for varying atomic percentages of the proportion of W in the range of from 20 to 95 at %, placing each set of Mo and W powders in a ball mill having the inner wall thereof coated with Mo, and mixing them for 30 hours by the use of balls made of nylon. The mixed powders were each packed in a shaping mold and shaped by a wet-CIP treatment under pressure of 200 MPa. The shaped masses consequently obtained were sintered in an ambience of hydrogen under the conditions of 2073K×10 hours to obtain sinters having density of 90%. The sinters thus obtained were each subjected to the mechanical workings of cutting and grinding to produce Mo—W targets measuring 250 mm in diameter and 8 mm in thickness and having a varying composition. These Mo—W targets were each bonded with an In type solder to a packing plate made of oxygen-free copper and set in place in a sputtering device.

Figure 6:
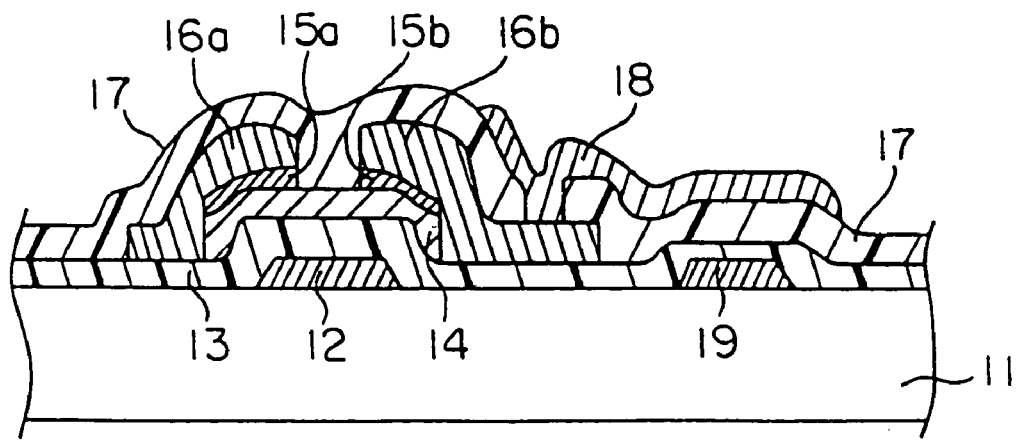
FIG. 6 is a cross section of a TFT and a storage capacity part to be used in another liquid crystal display device.

FIG. 6 is a cross section of the arrangement of a TFT and a storage capacity part used in a liquid crystal display device different from the one used in Example 1. The construction and the process of the TFT and the storage capacity part will be described below.

On a glass substrate 11, a prescribed wiring metal such as Mo—Ta was sputtered in 300 nm to form simultaneously a gate electrode 12, an address line, and a Cs line 19. Then, by the plasma CVD, a-Si islands were formed by continuously depositing an oxide film or a nitride film 13 in a thickness of 350 nm, an a-Si layer 14 in a thickness of 300 nm, and n$^+$ a-Si layers 5a and 5b each in a thickness of 50 nm.

Subsequently, a contact hole was formed by etching with dilute hydrofluoric acid and the surface oxide film was removed.

Then, by sputtering the Mo—W target of this invention mentioned above and wet etching it, a source electrode 16a, a drain electrode 16b, and data wiring were simultaneously formed. An oxide film 17 was formed in a thickness of 300 nm and a contact hole was formed on the drain electrode 16b by either etching with a HF type solvent (at an etching rate of about 10 nm/min, for example) or dry etching with such a gas as $CF_4$ (at an etching rate in the rate of about 3 to 10 nm/min, for example) and a picture element electrode 18 was formed in a thickness of 120 nm by sputtering ITO.

The Mo—W wiring thin film which was formed with the Mo—W target of this invention mentioned above excelled in chemical resistance as described in Example 1. The data wirings formed of the Mo—W wiring thin film excelling in chemical resistance as described above could be effectively subjected to a tapering work without entailing deterioration of a resist by using an alkali etchant (pH 7~13) containing an oxidizing agent of high redox potential instead of the etchant which would be used for etching a Mo film or a W film.

In the picture element array consequently formed, since the data wirings were given a tapering work, the interlayer insulating film formed on the data wirings had fully satisfactory step coverage and could retain dielectric strength at a high level. Further, since the drain electrode 16b excelled in chemical resistance, a contact hole could be formed by etching with hydrofluoric acid on the drain electrode 16b and the picture element electrode could be worked with a mixed liquid consisting of chlorine with nitric acid. Moreover, the wirings formed with the Mo—W wiring thin film of the present invention, unlike those formed with Al, were found to generate no hillock and have no use for a barrier metal because they were incapable of reacting with ITO.

As demonstrated in Example 1, the Mo—W wiring thin film of this invention possesses basically low resistance and, because the stress thereof is notably varied by the mixing ratio of Mo and W in the Mo—W alloy, is allowed to lower the stress as required.

The working example described above is one embodiment of this invention. It can be modified with the thicknesses of the component layers and the methods of film formation suitably altered. Notwithstanding such modifications, this invention produces the same effect as is obtained in the present example. The TFT may be in some other structure such as is obtained by providing stoppers for the insulating film on channels. The storage capacity part may be in such a structure that it is formed in wirings in the same layer as the gate electrode and in wirings in the same layer as the data wirings.

EXAMPLE 3

Uniform mixed powders were obtained by weighing out a Mo powder having an average particle diameter of 10 μm and a W powder having an average particle diameter of 10 μm in amounts calculated to account for varying atomic percentages of the proportion of W in the range of from 20 to 95 at %, placing each set of Mo and W powders in a ball mill having the inner wall thereof coated with Mo, and mixing them for 24 hours by the use of balls made of nylon. The mixed powders were each packed in a shaping mold and shaped by a wet-CIP treatment under pressure of 200 MPa. The shaped masses consequently obtained were sintered in an ambience of hydrogen under the conditions of 2073K and 8 hours to obtain sinters having density of 90%. The sinters were each subjected further an HIP treatment under the conditions of 2073K, 4 hours, and 180 MPa to obtain sinters having density of 98%. Then, the sinters thus obtained were subjected to the mechanical workings of cutting and grinding to produce target pieces measuring 180 mm in length, 180 mm in width, and 6 mm in width. The target pieces were joined side by side in three columns and two rows to obtain Mo—W targets. These Mo—W targets were each bonded with an In type solder to a packing plate made of oxygen-free copper and set in place in a sputtering device.

Figure 7:
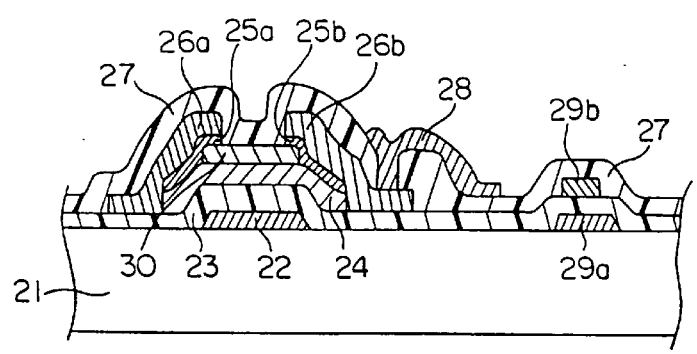
FIG. 7 is a cross-section of a TFT and a storage capacity part to be used in another liquid crystal display device.

FIG. 7 is a cross section of the TFT and the storage capacity part to be used in a liquid crystal display device different from the ones used in Examples 1 and 2. In the liquid crystal display device of this invention, like that of Example 1, the Mo—W target of this invention mentioned above was sputtered in 300 nm to form a gate electrode 22, an address line, and a Cs line 29a simultaneously on a glass substrate 21. Then, in the same manner as in Example 2, the Mo—W target of this invention was sputtered and subsequently wet etched to form a source electrode 26a, a drain electrode 26b, and data wirings simultaneously.

The liquid crystal display device of Example 3 uses a TFT so constructed as to have stoppers for the insulating film provided on channels instead of the TFT of the back channel cut type having the channel part etched as adopted in Example 2. The storage capacity part was formed with wirings laid in the same layer as the gate electrode and ones laid in the same layer as the data wirings.

Specifically, the Mo—W target of this invention was sputtered to form the gate electrode 22, the address line, and the Cs line 29a simultaneously on the glass substrate 21. Then, an interlayer insulating film 23, an a-Si layer 24, a channel protecting layer 30, and n+ a-Si layers 25a and 25b were formed sequentially. Subsequently, by sputtering the Mo—W target, a source electrode 26a, a drain electrode 26b, data wirings, and a Cs line 29b were simultaneously formed. Then, an oxide film 27 was formed and a contact hole was formed on the drain electrode 26b, and a picture element electrode 28 was formed.

According to Example 3 described above, the effect obtained in Example 1 and that obtained in Example 2 were both obtained at the same time.

This invention is not limited to the working examples described above. The semiconductor is not limited to the a-Si but may be a p-Si, a CdSe, or the like instead. The insulating film on the data wirings is not limited to an oxide film but may be a nitride film. Further, in the wiring thin film of this invention, two or more superposed films formed of Mo—W alloys of different compositions may be formed in the place of the one-layer films used in the working examples. The wiring thin film of this invention may be vested with improved resistance to oxidation by having a layer of Ta, Tan, or the like superposed on the wiring thin film. The wiring thin film of this invention may have the resistance thereof lowered by having a layer of Al, Cu, or the like superposed on the lower side of the wiring thin film.

EXAMPLE 4

Mixed powders prepared by mixing a Mo powder having an average particle diameter of 4.5 μm and a W powder having an average particle diameter of 3.6 μm at prescribed ratios were each packed in a rubber shaping mold and subjected to CIP under pressure of 200 MPa to produce shaped masses. The shaped masses were sintered in an ambience of hydrogen under varying conditions, which were as shown in Table 2 and Table 3. The resultant sinters were heated in an ambience of hydrogen and hot rolled crosswise. The rolling conditions were as shown in Table 2 and Table 3. The rolled blanks consequently obtained were heat-treated under the conditions shown in Table 2 and Table 3 and then mechanically worked to produce Mo—W targets measuring 250 mm in diameter and 8 mm in thickness. The Mo—W targets, No. 1 through No. 40, shown in Table 2 and Table 3 were thus obtained.

Referential Examples (No. 41 through No. 48) shown in Table 3 cover Mo—W targets manufactured by following the procedure of Example 4 while setting any of the conditions for sintering in hydrogen, the conditions for rolling, and the conditions for heat treatment outside the preferred ranges specified by this invention.

TABLE 2

| | | Composition (at %) | | Conditions for sintering in hydrogen | | Conditions for rolling | | Conditions for heat treatment | |
|---|---|---|---|---|---|---|---|---|---|
| | Sample No. | W | Mo | Temperature (K) | Time (hr) | Temperature (K) | Rolling ratio (%) | Temperature (K) | Time (hr) |
| Example 4 | 1 | 25 | bal | 2173 | 15 | 1673 | 55 | 1773 | 3 |
| | 2 | 25 | bal | 2173 | 25 | 1773 | 61 | 1873 | 3 |
| | 3 | 25 | bal | 2273 | 25 | 1773 | 62 | 1873 | 3 |
| | 4 | 25 | bal | 2473 | 10 | 1773 | 69 | 1673 | 3 |
| | 5 | 25 | bal | 2473 | 24 | 1773 | 74 | 1773 | 3 |
| | 6 | 30 | bal | 2173 | 20 | 1673 | 51 | 1673 | 3 |
| | 7 | 30 | bal | 2273 | 30 | 1773 | 64 | 1673 | 3 |
| | 8 | 30 | bal | 2373 | 25 | 1873 | 69 | 1773 | 3 |
| | 9 | 35 | bal | 2173 | 20 | 1773 | 56 | 1773 | 3 |
| | 10 | 35 | bal | 2373 | 25 | 1773 | 64 | 1773 | 3 |
| | 11 | 35 | bal | 2473 | 15 | 1773 | 72 | 1673 | 3 |
| | 12 | 35 | bal | 2473 | 24 | 1873 | 74 | 1873 | 3 |
| | 13 | 40 | bal | 2273 | 15 | 1673 | 58 | 1873 | 3 |
| | 14 | 40 | bal | 2473 | 10 | 1773 | 67 | 1673 | 3 |
| | 15 | 40 | bal | 2473 | 24 | 1973 | 72 | 1773 | 3 |
| | 16 | 45 | bal | 2373 | 25 | 1773 | 58 | 1673 | 3 |
| | 17 | 45 | bal | 2373 | 10 | 1873 | 60 | 1673 | 3 |
| | 18 | 45 | bal | 2473 | 24 | 1873 | 70 | 1773 | 3 |

TABLE 2-continued

| Sample No. | Composition (at %) W | Composition (at %) Mo | Conditions for sintering in hydrogen Temperature (K) | Conditions for sintering in hydrogen Time (hr) | Conditions for rolling Temperature (K) | Conditions for rolling Rolling ratio (%) | Conditions for heat treatment Temperature (K) | Conditions for heat treatment Time (hr) |
|---|---|---|---|---|---|---|---|---|
| 19 | 50 | bal | 2173 | 15 | 1773 | 61 | 1773 | 3 |
| 20 | 50 | bal | 2273 | 25 | 1873 | 68 | 1873 | 3 |
| 21 | 50 | bal | 2373 | 24 | 1873 | 69 | 1673 | 3 |
| 22 | 50 | bal | 2373 | 30 | 1873 | 68 | 1773 | 3 |
| 23 | 50 | bal | 2473 | 18 | 1873 | 70 | 1673 | 3 |
| 24 | 60 | bal | 2273 | 20 | 1773 | 56 | 1773 | 3 |

TABLE 2

| | Sample No. | Composition (at %) W | Composition (at %) Mo | Conditions for sintering in hydrogen Temperature (K) | Conditions for sintering in hydrogen Time (hr) | Conditions for rolling Temperature (K) | Conditions for rolling Rolling ratio (%) | Conditions for heat treatment Temperature (K) | Conditions for heat treatment Time (hr) |
|---|---|---|---|---|---|---|---|---|---|
| Example 4 | 25 | 60 | bal | 2373 | 24 | 1973 | 69 | 1673 | 3 |
| | 26 | 60 | bal | 2373 | 30 | 1773 | 66 | 1673 | 3 |
| | 27 | 60 | bal | 2473 | 30 | 1973 | 66 | 1673 | 3 |
| | 28 | 65 | bal | 2373 | 25 | 1873 | 60 | 1873 | 3 |
| | 29 | 65 | bal | 2473 | 10 | 1973 | 54 | 1773 | 3 |
| | 30 | 65 | bal | 2473 | 24 | 1973 | 73 | 1873 | 3 |
| | 31 | 70 | bal | 2473 | 10 | 1773 | 70 | 1973 | 3 |
| | 32 | 70 | bal | 2473 | 25 | 1773 | 68 | 1673 | 3 |
| | 33 | 70 | bal | 2473 | 25 | 1873 | 72 | 1873 | 3 |
| | 34 | 80 | bal | 2373 | 20 | 1773 | 62 | 1873 | 3 |
| | 35 | 80 | bal | 2473 | 20 | 1873 | 64 | 1773 | 3 |
| | 36 | 80 | bal | 2473 | 20 | 1873 | 70 | 1773 | 3 |
| | 37 | 90 | bal | 2373 | 24 | 1873 | 59 | 1973 | 3 |
| | 38 | 90 | bal | 2473 | 24 | 1973 | 60 | 1873 | 3 |
| | 39 | 90 | bal | 2473 | 24 | 1973 | 75 | 1873 | 3 |
| | 40 | 90 | bal | 2473 | 30 | 1873 | 71 | 1973 | 3 |
| Referential Example | 41 | 30 | bal | 1973 | 24 | 1873 | — | — | — |
| | 42 | 30 | bal | 2073 | 8 | 1773 | — | — | — |
| | 43 | 40 | bal | 2073 | 25 | 1773 | 45 | 1773 | 3 |
| | 44 | 40 | bal | 2373 | 25 | 1473 | — | — | — |
| | 45 | 40 | bal | 2373 | 25 | 1773 | 25 | 1773 | 3 |
| | 46 | 40 | bal | 2473 | 25 | — | — | 1673 | 3 |
| | 47 | 40 | bal | 2473 | 25 | 1773 | 76 | 1073 | 3 |
| | 48 | 40 | bal | 2473 | 25 | 1773 | 81 | 1673 | 3 |

The Mo—W targets obtained in Example 4 and Referential Example mentioned above were tested for relative density, average particle diameter of grains, and Vickers hardness. The results were as shown in Table 4 and Table 5. These Mo—W targets were each set in place in a DC magnetron sputter device and sputtered on a 6-inch Si wafer to form a Mo—W alloy film (in a thickness of 30 nm). The Mo—W alloy films consequently obtained were visually examined to take count of the numbers of particles of not less than 0.3 μm existing in the films. The numbers of particles thus determined by the visual examination were those found in Mo—W alloy films which remained after removal of edge portions 5 mm in width from the relevant 6-inch Si wafers. The results of this visual examination are additionally shown in Table 4 and Table 5.

TABLE 4

| | Sample No. | Relative density (%) | Average particle diameter (μm) | Vickers hardness (Hv) | Number of particles (pieces) |
|---|---|---|---|---|---|
| Example 4 | 1 | 98.2 | 183 | 287 | 83 |
| | 2 | 98.6 | 171 | 279 | 62 |
| | 3 | 98.6 | 173 | 263 | 44 |
| | 4 | 99.4 | 164 | 248 | 30 |
| | 5 | 100 | 107 | 220 | 23 |
| | 6 | 98.0 | 184 | 264 | 89 |
| | 7 | 98.4 | 139 | 240 | 72 |
| | 8 | 99.1 | 119 | 231 | 63 |
| | 9 | 98.0 | 208 | 276 | 84 |
| | 10 | 99.3 | 123 | 252 | 40 |
| | 11 | 100 | 183 | 306 | 36 |
| | 12 | 100 | 89 | 212 | 23 |

TABLE 4-continued

| Sample No. | Relative density (%) | Average particle diameter (μm) | Vickers hardness (Hv) | Number of particles (pieces) |
|---|---|---|---|---|
| 13 | 98.1 | 138 | 200 | 66 |
| 14 | 99.2 | 222 | 304 | 56 |
| 15 | 100 | 123 | 268 | 33 |
| 16 | 98.0 | 201 | 298 | 93 |
| 17 | 98.4 | 189 | 291 | 93 |
| 18 | 100 | 92 | 276 | 29 |
| 19 | 98.1 | 183 | 252 | 72 |
| 20 | 99.4 | 107 | 229 | 39 |
| 21 | 99.2 | 238 | 277 | 78 |
| 22 | 99.5 | 110 | 240 | 41 |
| 23 | 99.8 | 77 | 236 | 31 |
| 24 | 98.3 | 141 | 281 | 81 |

TABLE 5

| | Sample No. | Relative density (%) | Average particle diameter (μm) | Vickers hardness (Hv) | Number of particles (pieces) |
|---|---|---|---|---|---|
| Example 4 | 25 | 99.8 | 130 | 262 | 28 |
| | 26 | 99.0 | 148 | 268 | 42 |
| | 27 | 100 | 88 | 244 | 25 |
| | 28 | 99.2 | 101 | 234 | 44 |
| | 29 | 99.3 | 124 | 256 | 70 |
| | 30 | 100 | 69 | 210 | 20 |
| | 31 | 99.4 | 71 | 221 | 63 |
| | 32 | 100 | 74 | 240 | 26 |
| | 33 | 100 | 67 | 198 | 18 |
| | 34 | 99.6 | 93 | 212 | 47 |
| | 35 | 99.9 | 62 | 220 | 31 |
| | 36 | 100 | 59 | 231 | 28 |
| | 37 | 99.3 | 82 | 209 | 82 |
| | 38 | 99.7 | 72 | 224 | 42 |
| | 39 | 100 | 46 | 190 | 14 |
| | 40 | 99.8 | 53 | 186 | 29 |
| Referential Example | 41 | (breakage) | — | — | — |
| | 42 | (breakage) | — | — | — |
| | 43 | 97.3 | 183 | 292 | 186 |
| | 44 | (breakage) | — | — | — |
| | 45 | 93.8 | 89 | 261 | 312 |
| | 46 | 90.4 | 46 | 171 | 387 |
| | 47 | 100 | 206 | 373 | 138 |
| | 48 | 100 | 326 | 296 | 122 |

It is clearly noted from Table 4 and Table 5 that the Mo—W targets obtained in Example 4 invariably had relative density of not less than 98% and Vickers hardness, Hv, of not more than 350.

It was further found that the films formed of these Mo—W targets generated particles in markedly lowered numbers.

Figure 8:
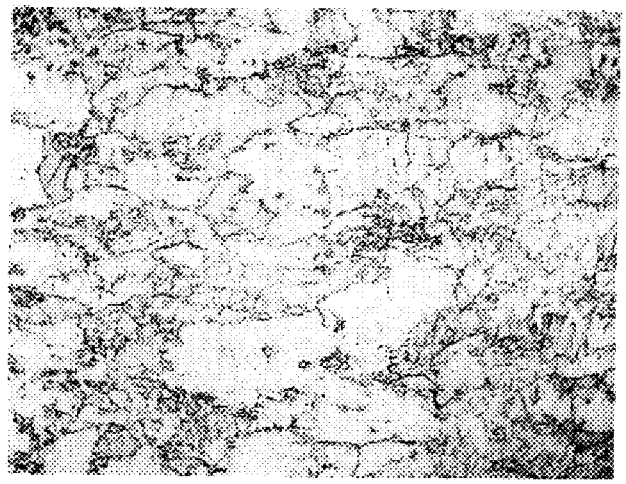
FIG. 8 is a photomicrograph showing in a magnified scale the metallic texture of a Mo—W target formed in one working example of this invention.
Figure 9:
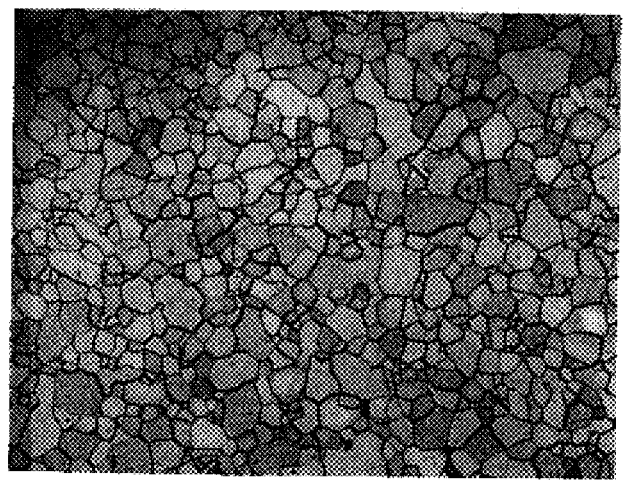
FIG. 9 is a photo-micrograph showing in a magnified scale the metallic texture of a Mo—W target formed in another working example of this invention.
Figure 10:
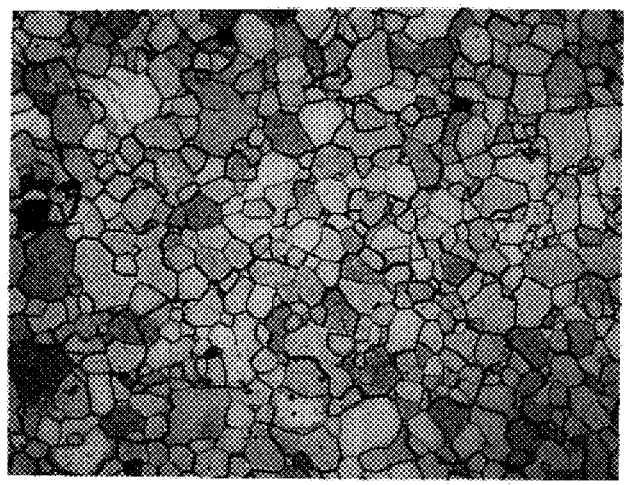
FIG. 10 is a photomicrograph showing in a magnified scale the metallic texture of a Mo—W target formed in yet another working example of this invention.

An optical photomicrograph showing on a magnified scale (100 magnifications) the metallic texture of the Mo—W target, Sample No. 11, of Example 4 is given in FIG. 8, an optical photo-micrograph showing on a magnified scale (100 magnifications) the metallic texture of the Mo—W target, Sample No. 15 is given in FIG. 9, and an optical photomicrograph showing on a magnified scale (100 magnifications) the metallic texture of the Mo—W target, Sample No. 31 is given in FIG. 10. Then, an optical photomicrograph showing on a magnified scale (100 magnifications) the metallic texture of the Mo—W target, Sample No. 47 of Referential Example is given in FIG. 11.

Figure 11:
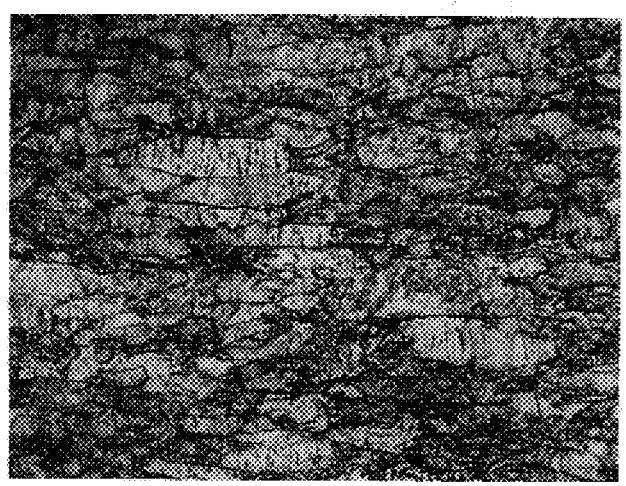
FIG. 11 is a photo-micrograph showing in a magnified scale the metallic texture of a Mo—W target formed for referential purpose.

FIG. 8 shows the metallic texture in a state relieved of strain. In contrast, FIG. 11 shows the metallic texture in a state not fully relieved of strain because of a low temperature of the heat treatment used for relief of strain. FIG. 9 and FIG. 10 show the metallic textures both in a state relieved of strain and recrystallized. The Mo—W targets of FIG. 9 and FIG. 10 were thoroughly relieved of strain by being recrystallized. The Mo—W targets particularly of this invention, therefore, prove ideal. Though the metallic texture of FIG. 8 is in a state relieved of strain, the degree of relief of strain is not so thorough as in the metallic textures of FIG. 9 and FIG. 10. Thus, the Mo—W target of FIG. 8 which retained strain to a certain extent had the possibility of warping while in use and peeling off a backing plate. It was in need of recrystallization. FIG. 10 shows a sign of the occurrence of a few pores in crystals of the metallic texture due to an unduly high temperature of the heat treatment performed for the relief of strain. This fact indicates that the temperature of the heat treatment ought to have been fixed at a level not so high as to induce occurrence of such pores.

When the liquid crystal display devices shown in Example 1, Example 2, and Example 3 described above were manufactured with the Mo—W target obtained in Example 4, they invariably showed fully satisfactory results. Then, the Mo—W wiring thin film produced with the Mo—W target of Example 4 generated particles in a markedly decreased number and, hence, proved to be capable of further enhancing the electrical properties of the address wirings and the data wirings.

This invention is not limited to the constructions of the various working examples cited above and the methods of production described in these working examples. It can be embodied in all the products using the Mo—W material and the Mo—W target according to this invention and in all the products using the Mo—W wiring thin film according to this invention. It is not limited to the wirings and others of the liquid crystal display devices but may be effectively used in wirings for plasma display devices, solid display devices, and planar display devices using a field-emission cold cathode.

INDUSTRIAL APPLICABILITY

It is clearly demonstrated by the examples cited above that the Mo—W material of this invention for the formation of wirings manifests low resistance, permits a tapering work, and excels tolerance for an etchant and, therefore, proves to be a highly useful material for the formation of address wirings and data wirings as in liquid crystal display devices. The Mo—W wiring thin film of this invention uses the Mo—W material (Mo—W alloy) of the quality mentioned above and, therefore, contributes immensely to enhance the operating characteristics and the reliability of liquid crystal display devices. The Mo—W target of this invention for the formation of wirings allows the Mo—W wiring thin film of the quality mentioned above to be formed advantageously with high repeatability.

The invention claimed is:

1. A Mo—W wiring thin film consisting essentially of 20 to 95% of tungsten and the balance of molybdenum and inevitable impurities by atomic percentage.

2. The Mo—W wiring thin film according to claim 1, wherein the proportion of said tungsten in the whole composition is in the range of from 20 to 70% by atomic percentage.

3. The Mo—W wiring thin film according to claim 1, wherein the proportion of said tungsten in the whole composition is in the range of from 25 to 45% by atomic percentage.

4. The Mo—W wiring thin film according to claim 1, wherein the content of oxygen in the wiring thin film is not more than 500 ppm.

5. The Mo—W wiring thin film according to claim 1, wherein the content of oxygen in the wiring thin film is not more than 200 ppm.

6. The Mo—W wiring thin film according to claim 1, wherein the content of oxygen in the wiring thin film is not more than 100 ppm.

7. The Mo—W wiring thin film according to claim 1, wherein the content of oxygen in the wiring thin film is not more than 50 ppm.

8. The Mo—W wiring thin film according to claim 1, wherein the wiring thin film has an oxide layer formed on the surface thereof.

9. The Mo—W wiring thin film according to claim 1, wherein the wiring thin film is used in a wiring of a display device.

10. The Mo—W wiring thin film according to claim 9, wherein the display device is a liquid crystal display device.

11. The Mo—W wiring thin film according to claim 9, wherein the display device is a plasma display device, a solid display device, or a display device using a field-emission cold cathode.

* * * * *